United States Patent
Li et al.

(10) Patent No.: US 6,168,726 B1
(45) Date of Patent: Jan. 2, 2001

(54) ETCHING AN OXIDIZED ORGANO-SILANE FILM

(75) Inventors: Zongyu Li, Cupertino; Jian Ding; Mehul Naik, both of San Jose, all of CA (US)

(73) Assignee: Applied Materials, Inc., Santa Clara, CA (US)

(*) Notice: Under 35 U.S.C. 154(b), the term of this patent shall be extended for 0 days.

(21) Appl. No.: 09/200,086

(22) Filed: Nov. 25, 1998

(51) Int. Cl.$^7$ ........................................ B44C 1/22
(52) U.S. Cl. .................... 216/79; 216/67; 438/718; 438/725
(58) Field of Search ................... 216/62, 63, 67, 216/68, 81, 79; 438/710, 718, 725

(56) References Cited

U.S. PATENT DOCUMENTS

| | | | |
|---|---|---|---|
| 4,981,724 | 1/1991 | Hochberg et al. | 427/255.3 |
| 5,314,724 * | 5/1994 | Tsukune et al. | 427/489 |
| 5,567,271 * | 10/1996 | Chu et al. | 156/659.11 |
| 5,994,232 * | 11/1999 | Clampitt | 438/706 |
| 6,007,733 * | 12/1999 | Jang et al. | 216/80 |
| 6,010,967 * | 1/2000 | Donohoe et al. | 438/718 |
| 6,030,901 * | 2/2000 | Hopper et al. | 438/711 |
| 6,039,888 * | 3/2000 | Ha et al. | 216/13 |
| 6,072,227 * | 6/2000 | Yau et al. | 257/642 |

FOREIGN PATENT DOCUMENTS

840365 A2   5/1998 (EP).

* cited by examiner

*Primary Examiner*—Gregory Mills
*Assistant Examiner*—Luz L. Alejandro
(74) *Attorney, Agent, or Firm*—Charles Guenzer (57) ABSTRACT

A process for etching an oxidized organo-silane film exhibiting a low dielectric constant and having a most preferred atomic composition of 52% hydrogen, 8% carbon, 19% silicon, and 21% oxygen. The process of etching deep holes in the organo-silane film while stopping on a nitride or other non-oxide layer is preferably performed in an inductively coupled high-density plasma reactor with a main etching gas mixture of a fluorocarbon, such as $C_4F_8$, and argon while the pedestal electrode supporting the wafer is RF biased. For very deep and narrow holes, oxygen or nitrogen may be added to volatize carbon. In an integrated process in which an oxygen plasma is used either for the film etching or for post-etch treatments such as ashing or nitride removal, the oxygen plasma should be excited only when no RF bias is applied to the pedestal electrode, and thereafter the sample should be annealed in an inert environment to recover the low dielectric constant.

40 Claims, 2 Drawing Sheets

ETCHING AN OXIDIZED ORGANO-SILANE FILM

FIELD OF THE INVENTION

The invention relates generally to plasma etching of materials. In particular, the invention relates to etching insulating materials including hydrogen, silicon, carbon, and oxygen.

BACKGROUND ART

The integration level and speed in semiconductor integrated circuits continue to increase. The next generation of dynamic memories will have a capacity of 256 Mb and that of microprocessors will have upwards of ten million transistors. Further generations are being planned. Clock rates are available that equal 500 MHz, and they are expected to exceed 1 GHz in the future. The increased level of integration and higher speed have in large part been accomplished by shrinking the lateral sizes of the individual components.

However, the increasing proximity of features and, in particular, the long conductive interconnects extending horizontally on a complex integrated circuit, have introduced the problem of unintended interactions between those features. A complex integrated circuit must include a large number of horizontal interconnects linking active circuits in one part of the integrated circuit to another part. Simultaneously with the decrease in feature sizes, the overall size of the integrated circuit die has continued to somewhat increase. As a result, the length of the interconnects, which are often laid in parallel for a sizable distance of their runs, has increased or at the best not decreased, and their separation in the horizontal plane has significantly decreased. The amount of electrical coupling, more precisely expressed in terms of parasitic capacitance, between such lines is generally proportional to the ratio of their length to their separation. That is, the coupling necessarily increases with decreasing, line separation unless the overall size of the chip is reduced, and it is unlikely that chip size will be reduced in the long term.

Although the coupling problem seems to be worse within respective wiring levels, inter-level coupling also can occur across the thin inter-level dielectric layers interposed between multiple horizontal wiring levels. Advanced integrated circuits, particularly those of microprocessors and other complex logic, may include five or more wiring levels to provide the complicated interconnection paths. The thicknesses of these inter-level dielectric layers appear to be limited at somewhat less 1 µm because of dielectric breakdown. However, even at these thicknesses, inter-level capacitance and resultant inter-signal coupling can become problems.

Another way of viewing this problem is to consider the RC charging time τ between a long interconnect and a large neighboring and parallel electrically grounded feature. The charging time of the interconnect may be represented by $$\tau = R \cdot C, \quad (1)$$

where R is the resistance of the conductive interconnect and C is the capacitance between the interconnect and the grounded feature. The equation is somewhat more complicated for inter-line interaction, but the effect is much the same. For the extremely high speed operation required of advanced integrated circuits, the speed may be limited by the time constant associated with interconnects, which can be characterized by a maximum operation frequency $f_{max}$, $$f_{max} < \frac{1}{R \cdot C}, \quad (2)$$

although there may be other factors near unity in this relationship. Generally in advanced circuits, the intra-level capacitances between parallel horizontal interconnects, such as in an internal bus extending over a substantial fraction of the chip, limit the operating speed of the chip.

Up till the present time in the continuing development of integrated circuits, the increased speed has been accomplished in large part by decreasing the length of the polysilicon gate of the transistor, thereby increasing its speed. However, as the feature sizes decrease below 0.1 8 µm, the effects of the metallization begin to dominate in limiting the speed. Therefore, the composition of the metallization and the dielectric constant of the insulator begin to dominate.

One of the motivators for changing from aluminum to copper for advanced integrated circuits as the material of the interconnect is to reduce the value of R in Equation (1) because of the lower resistivity of copper compared to aluminum, the conventional material now used. It is greatly desired that this substitution of copper for aluminum as the metallization material not be compromised by a concurrent increase in the value of the inter-line capacitance C across the dielectric material as the feature sizes of integrated circuits further decrease.

The electrical characteristics of a dielectric material are quantified by its resistivity and its dielectric constant. For an insulator in an integrated circuit, the resistivity must be fairly high, approximately $10^{14}$ ohm-cm or higher. The capacitance C of an planar capacitive structure, whether intentional or parasitic, can be represented as $$C = \frac{k \cdot A}{d}, \quad (3)$$

where A is the area of the capacitive plates, d is the gap between the plates, and k is the dielectric constant of the material filling the gap. The relationship is somewhat more complex for interconnects, but the important factors are the same. Reduced dielectric constant k results in reduced capacitance, thus reducing the cross-talk and coupling, thus allowing increased operating speeds.

At the present time, the most common form of inter-level dielectric for integrated circuits is silicon dioxide or related silicate glasses, such as borophosphorosilicate glass (BPSG). These are all silicon-based materials having the approximate chemical composition $SiO_2$. Hereafter, these will be collectively referred to as silica. The dielectric constant k for silica is between 3.9 and 4.2. That for $Si_3N_4$, another common insulating material in present day integrated circuits, is even higher—7.5. For these reasons, there has been much recent interest in low-k dielectrics having a dielectric constant lower than 3.9.

Several low-k materials have been proposed for use as the inter-level and intra-level dielectric. Some proposed low-k materials are silicon-based, for example, fluorinated silica glass (FSG, k=3.5), hydrophobic porous spin on glass (HPS, k=2.5~3), hydrogen-silsesquioxane (HSQ, k=2.5~2.9). A silicon-based material contains on an elemental basis more silicon than carbon and is typically based on $SiO_2$ or $Si_3N_4$.

Other proposed low-k dielectric are carbon-based. By a carbon-based material is meant a material containing more carbon than either or both of silicon or oxygen. Most carbon-based low-k materials are fundamentally organic polymers. In contrast, a silicon-based material contains more silicon than carbon and is typically based on $SiO_2$ or $Si_3N_4$.

One carbon-based low-k material is disclosed by Li et al. in U.S. patent application Ser. No. 09/156,956, filed Sep. 18, 1998. The material is bivinylsiloxane-benzocyclobutene (BCB), which contains a few percent of silicon, but is otherwise an organic polymer including carbon, oxygen, and hydrogen. Like many other carbon-based dielectrics, BCB is spun onto the wafer in a liquid solvent and is then dried and cured to form the polymer. Although BCB is harder than many other carbon-based low-k materials, it is still much softer than the silica it is expected to replace. A soft dielectric is disadvantageous for advanced processing which is expected be based on damascene or dual-damascene structures and to use chemical mechanical polishing (CMP) to remove excess metal over a dielectric layer patterned to also receive the metal in via holes and interconnect trenches. Metals such as aluminum or copper are much softer than silica so the chemical mechanical polishing of the metal can be arranged to effectively stop on the underlying silica outside the areas of the vias and trenches. Such stopping is more problematical with a softer dielectric such as BCB.

Furthermore, carbon-based dielectrics present problems in etching because the typical oxygen and nitrogen plasmas readily attack the photoresist mask, thus providing poor to no selectivity to photoresist. Plasma etching chemistry has been developed that selectively etches silica over non-oxide layers such as silicon nitride or silicon as well as selectively etching the silica over the overlying carbon-based photoresist. The selectivities available with etching oxide over non-oxide layers in large part depend upon the formation of a fluorocarbon polymer on the non-oxide layer, which protect the non-oxide layer from being etch. Under the right processing conditions, the polymer forms over the non-oxide layer but not over the oxide layer because the available oxygen combines with the carbon portion of the polymer to form volatile carbon dioxide. Excessive polymerization, however, may cause the polymer to deposit even on the bottom silica etch front, thereby stopping etching of a hole only part ways down. This deleterious effect is called etch stop, which is not to be confused with an etch stop layer to be described later. The polymer is also effective at passivating the oxide side walls, thus promoting a vertical etching profile. At least to date, the selectivities available with etching BCB or other carbon-based dielectric are much poorer than those available with silica-based dielectrics.

One recently developed low-k dielectric is carbon-doped silica, which is referred to as oxidized organo-silane because of its typical formation process. Applied Materials, Inc. of Santa Clara, Calif. is marketing such a dielectric material and methods and equipment for making it under the trade name of Black Diamond. Yau et al. have recently described a method of forming such an oxidized carbon-silicon material in U.S. patent application Ser. No. 09/021,788, filed Feb. 11, 1998, and Ser. No. 09/114,682, filed Jul. 13, 1998, both incorporated by reference in their entireties. They use a chemical vapor deposition (CVD) process with gaseous precursors of an organo-silane and an oxidizer to form a low-k dielectric having a dielectric constant in the range of 2.5 to 3. The CVD process is carried out in a low-power capacitively coupled plasma having a power density on the wafer of less than 1 $W/cm^2$ and at a temperature of less than 100° C. Its bulk hardness is approximately one third that of thermal oxide, a useful quality in CMP. They believe that the material is porous and that beneficial results are obtained with an oxidized organo-silane film having between 1 and 50% atomic doping with carbon, preferably around 20%.

More recent material characterization based upon Rutherford back scattering has established atomic composition including hydrogen, carbon, silicon, and oxygen in the atomic percentages given in TABLE 1.

TABLE 1

|    | Preferred | Observed Range |
|----|-----------|----------------|
| H  | 52        | 40–52          |
| C  | 8         | 5–11           |
| Si | 19        | 18–23          |
| O  | 21        | 21–37          |

We believe that the preferred hydrogen content is at least 30%, more preferably between 45 and 60%, that the preferred carbon content is between 5 and 20% atomic, more preferably between 6 and 10%, that the preferred silicon content is preferably between 15 and 30%, more preferably between 17 and 22%, and that the preferred oxygen content is between 10 and 45%, more preferably between 15 and 30%. Spectra taken with Fourier transform infrared (FTIR) spectroscopy show Si—C, Si—H, and Si—O bonds, again showing the presence of silicon, carbon, oxygen, and hydrogen with the indicated bonds. The lower density of the material implies that it is porous. Henceforward, this material will be referred to as an oxidized organo-silane film. However, this descriptor is defined by the compositions given above and is not limited to the method of formation of the film or the precursors used in the formation unless otherwise specified.

Plasma etching of oxidized organo-silane films needs to be developed, both for the etching of the material itself as well as in the context of an integrated process for forming useful integrated circuits.

It is advantageous to perform all the etch steps for a complex structure in a single reactor under somewhat similar conditions. The critical steps are preferably (though thought not necessarily) performed in a high-density plasma, which is defined as a plasma filling all the space it occupies, with the exception of the plasma sheath, and having an ionization density of at least $10^{11}$ $cm^{-3}$. The high-density plasma has the advantage of a high ionization fraction allowing deep penetration into a narrow and deep hole, of a fast etch rate, and the ability in the usual configuration of decoupling the plasma source power from the bias power.

The IPS (Inductive Plasma Source) etch reactor available from Applied Materials, Inc. of Santa Clara, Calif. can both generate the desired high-density plasma and can operate over a wide range of conditions. Collins et al. describe many features of the IPS Plasma Reactor, available from Applied Materials, Inc. of Santa Clara, Calif. and described by Collins et al. in U.S. patent application Ser. No. 08/733,594, filed Oct. 21, 1996 and in European Patent Publication EP-840,365-A2.

Figure 1:
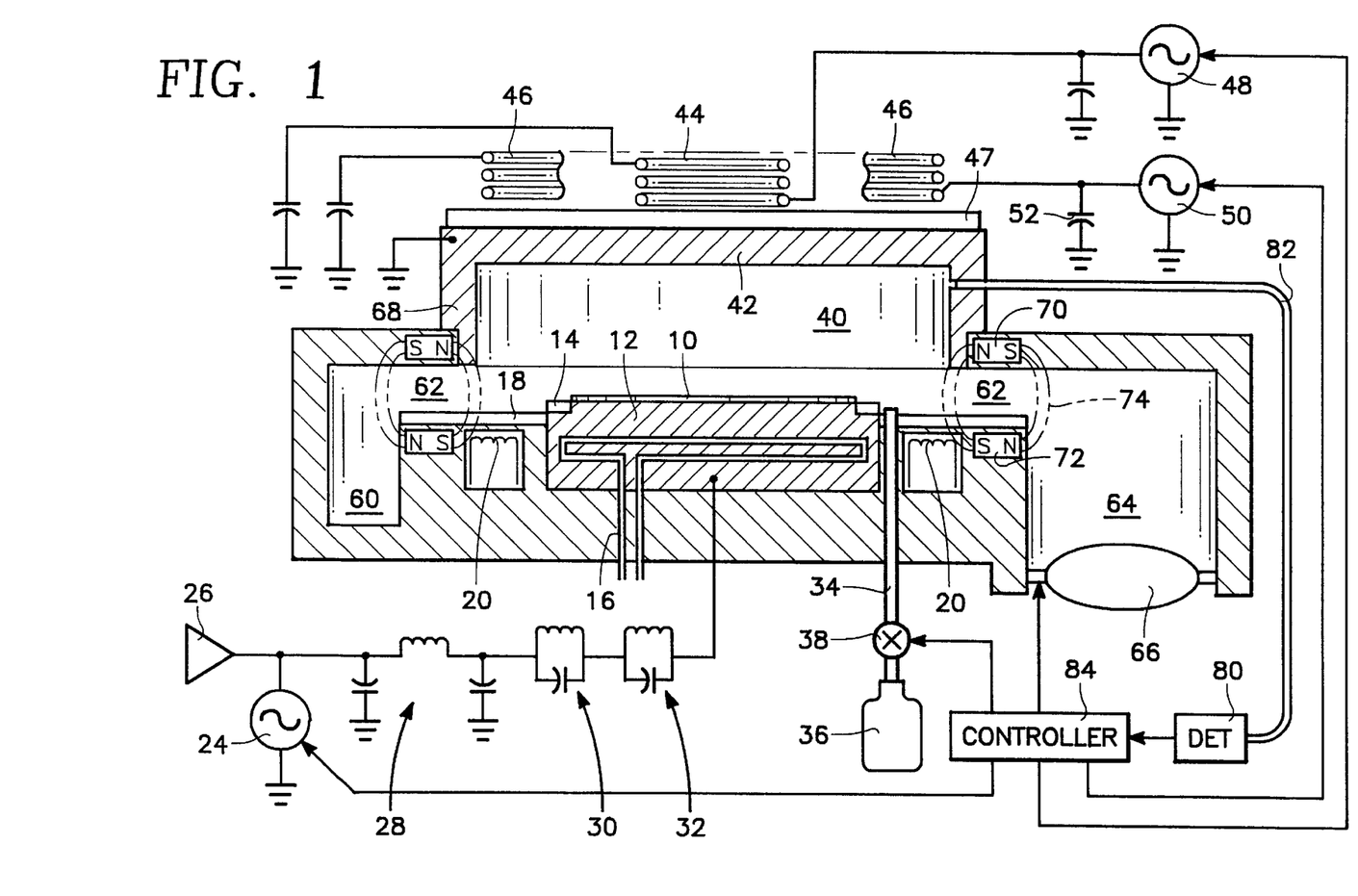
FIG. 1 is a schematic cross-sectional view of a inductively coupled high-density plasma reactor usable with the invention.

One version of the IPS reactor is illustrated schematically in FIG. 1. A wafer 10 is supported on a pedestal 12 operating as a cathode electrode and including an electrostatic chuck and a protective edge ring 14. A liquid cooling channel 16 passes through the pedestal 12, and an unillustrated chiller supplies cooling liquid to the cooling channel 16 to cool the pedestal 12 and attached wafer 10 to a predetermined temperature. A thermal transfer gas, such as helium, is maintained between the wafer 10 and the pedestal 12 to provide thermal conduction between the two. The temperature of the wafer 10 can be controlled not only by adjusting the chiller temperature but also by adjusting the backside gas pressure.

A silicon ring 18 surrounds the pedestal 12 and is controllably heated by a ring of lamps 20. Hot silicon can scavenge free fluorine from a plasma. A first RF power supply 24 and a electrostatic chuck driver and filter 26 are electrically connected to the pedestal 12 through a fixed bias network 28, a harmonic isolation filter 30, and a DC bypass choke circuit 32. Thus, the RF biased pedestal 22 acts as a cathode in opposition to the grounded silicon window 42 and grounded aluminum chamber wall 68. The first RF power supply 24, preferably operating at 1.6 MHz, supplies bias power to the pedestal electrode 12 while the electrostatic chuck driver and filter 26, operating essentially at DC, selectively chucks the wafer 10 to the electrostatic chuck. A lower gas feed 34 penetrates the silicon ring 18 and supplies gas mixture from several gas sources 36 through a bank of mass flow controllers 38 and an unillustrated common gas manifold to a processing region 40 over the pedestal 12.

A polysilicon window 42 is disposed in opposition to the pedestal 12. Its thickness and semiconductor doping level are chosen so that it both can be electrically grounded to act as an anode electrode and can pass generally axial RF magnetic fields generated by inner and outer inductive coils 44, 46 positioned behind the window 42. A thermal control plate 47 coupled to the back of window 42 and below the coils 44, 46 30 controls the temperature of the silicon window 42 by a combination of chilled water and radiant bulbs. The inner and outer coils 44, 46 are powered respectively by second and third RF power supplies 48, 50, preferably operating at 2.3 and 2.0 MHz respectively. The RF power supplies 48, 50 are connected to respective first ends of the coils 44, 46 and tuning and loading capacitors 52 are connected between the first and second ends of the coils 44, 46 and ground. The RF power is supplied to the coils 44, 46 in such proportions as to provide a more uniform plasma as the RF power is inductively coupled into the source region of the processing space 40 between the pedestal 12 and the window 42. The amount of power supplied to the coils 44, 46 is primarily responsible for the density or strength of the plasma and is referred to as the source power. The RF power supplied to the pedestal 12 is capacitively coupled into the plasma adjacent to the principal surface of the wafer 10, is responsible for the amount of DC bias of the plasma relative to the wafer 10, and is thus referred to as the bias power. The DC bias determines the energy of ions extracted from the plasma across the sheath adjacent to the wafer 10 and thus determines the energy of ions striking the wafer. High-energy ions effectively sputter, while lower-energy ions and neutral radicals striking the wafer from the plasma tend to participate in more of a chemical reaction.

An annular pumping channel 60 surrounds the processing region 40 and is connected to it through an annular flow constriction 62. An unillustrated 2000 liter/s turbo vacuum pump is connected through an exhaust manifold 64 to the pumping channel 60 to pump the processing region 40 through the constriction 62. An adjustable throttle valve 66 between the exhaust manifold 64 and the turbo pump controls the chamber pressure within the chamber defined generally by the pedestal 12, the silicon ring 18, the polysilicon window 42, and an electrically connected chamber wall 68. Two ring magnets 70, 72 are positioned respectively above and below the constriction 62 to the pumping channel 60. Both magnets 70, 72 have an inner annular portion of one magnetic pole and an outer portion of the other magnetic pole. However, the pole orientations are reversed between the two magnets 70, 72 so that they induce a generally toroidal static magnet field 74 in the area of the flow constriction 62. This magnetic field acts to confine the plasma to within the processing region 40 and to exclude it from the pumping channel 60.

Tight end point control can be implemented with a photodetector 80 coupled to an optical fiber 82 mounted to the chamber wall to view the plasma processing region 40. The detector 40 includes one or more optical filters to pick out the CO or other plasma emission associated with photoresist byproducts or the CN or other plasma emission associated with nitride byproducts from the stop layer. The detector output is input to a system controller 84.

The various etching recipes are input on optical or magnetic media into the controller 84 and stored there so it can control the processing conditions. For the present invention, the principal processing conditions are effected by the bank of mass flow controllers 38, the RF power supplies, 24, 48, 50, the throttle valve 66, and by unillustrated drivers and controls for the ring heaters 20, the thermal control plate 47, and the cathode cooling channel 16.

The IPS chamber can be operated with a high-density or a low-density plasma.

The temperature of the silicon surfaces and of the wafer can be separately controlled. The RF bias power applied to the cathode 12 can be adjusted independently of the source power applied to the coils 44, 46, thus decoupling the ion energy from the plasma density. This plasma reactor is very flexible and can operate in a number of different modes, thus allowing the possibility of much of an integrated etch process being performed in the single reactor.

It is desirable to explore the use of the IPS chamber to provide the advanced and flexible processing probably required for a complex material such as an oxidized organo-silane film, especially when the film etching needs to be incorporated in an integrated process.

SUMMARY OF THE INVENTION

The invention may be summarized as a method of etching oxidized organo-silane films or equivalent films containing hydrogen, carbon, silicon, and oxygen, which are particularly useful in some applications because of their low dielectric constants. The etching method includes flowing an etching gas comprising a fluorocarbon and a chemically inactive gas such as argon into a plasma reaction chamber and exciting it into a plasma, preferably a high-density plasma.

For deep hole etching, nitrogen or oxygen is added to the etching gas. An integrated process for selectively etching an oxidized organo-silane film above a non-oxide layer such as silicon nitride includes one or more post-etch treatments including an oxygen plasma for removing, for example, the nitride, photoresist, and residues. The oxygen plasma treatment should be performed with no or very low pedestal bias. Thereafter, a post-oxygen anneal is performed in an inert atmosphere, thereby restoring the low dielectric constant.

DETAILED DESCRIPTION OF THE PREFERRED EMBODIMENTS

A set of preliminary a number of chemistries were attempted on blanket wafers having a layer of an oxidized organo-silane film on their surface. That is, there was no significant horizontal structure on the wafer. The various recipes applied to the open structure of oxidized organo-silane films are summarized in the data of TABLE 2.

TABLE 2

| Recipe | 1 | 2 | 3 | 4 | 5 | 6 | 7 |
|---|---|---|---|---|---|---|---|
| $CHF_3$ (sccm) | | | | | | 80 | 80 |
| $C_2F_6$ (sccm) | | | 10 | 10 | 10 | | |
| $C_4F_8$ (sccm) | 16 | 16 | 10 | 10 | 10 | | |
| CO (sccm) | | | | | 30 | | 15 |
| Ar (sccm) | 100 | 100 | 100 | 100 | 100 | 350 | 350 |
| $O_2$ (sccm) | | | | 20 | | | |
| Source Power (W) | 1120 | 1120 | 1300 | 1350 | 1350 | 2710 | 2710 |
| Bias Power (W) | 1500 | 1500 | 1600 | 1600 | 1600 | 1400 | 1400 |
| Pressure (mT) | 7 | 7 | 10 | 10 | 10 | 75 | 75 |
| Roof Temp. (° C.) | 150 | 200 | 150 | 150 | 150 | 150 | 150 |
| Ring Temp. (° C.) | 250 | 270 | 250 | 250 | 250 | 350 | 350 |
| Cathode Temp. (° C.) | −10 | −10 | −10 | −10 | −10 | −10 | −10 |
| He Pressure (T) | 10 | 10 | 10 | 10 | 10 | 10 | 10 |
| Etch Rate (nm/min) | 708 | 696 | 787 | 626 | 694 | 890 | 895 |

These recipes are derived from conventional oxide etch recipes, that is, recipes for etching carbon-free silica. The source power is distributed between the inner and outer coils 44, 46 in proportions to optimize uniformity. The recipes may be characterized as having a relatively high proportion of the chemically inactive argon, larger by at least a factor of three than the fluorocarbon. Most of them use no oxygen. A relatively large bias power is used, at least 50% of the plasma source power. The cathode temperature is kept below 0° C., and the silicon ring is thermally activated to above 230° C. A wide range of chamber pressures have been tried in the range of 1 to 100 milliTorr.

All the recipes provide acceptable results on the open structures of oxidized organo-silane films. Etch rates for the oxidized organo-silane films are about 50% higher than for corresponding recipes used with silica. The CO is sometimes used to increase selectivity and to provide a vertical hole profile. However, the experiments show that it somewhat reduces the etch rate in Recipe-5 compared to Recipe-3. Oxygen was added since oxygen is believed to be needed to remove the carbon component by forming volatile CO. Instead, it seems to decrease the oxidized organo-silane film etch rate. The tests on the blanket wafers provide no information on selectivity to either photoresist or nitride.

A low-k dielectric such as an oxidized organo-silane film is required for advanced semiconductor structures having very narrow features and usually requiring the etching of holes of high-aspect ratios with good vertical profiles and further requiring high selectivity to underlying materials acting as stop layers. An example of an advanced structure to which it is desired to apply low-k dielectrics and in particular oxidized organo-silane films is a dual-damascene via, illustrated isometrically in FIG. 2. A via is an electrical contact through an inter-level dielectric layer separating two levels of metallization. A substrate 90 includes multiple horizontal interconnects 92 formed in its surface (only one is illustrated), which are composed of aluminum or more preferably of copper. Over the substrate are sequentially formed a lower stop layer 94, a lower dielectric layer 96, an upper stop layer 98, an upper dielectric layer 100, and a cap layer 102. The stop layers 94, 98 are dielectric layers having etching characteristics different than those of the dielectric layers 96, 100 such that a selective etch can be used which etches the dielectric layer but stops on the stop layer. It is noted however that some dual-damascene processes rely on timed etches through the middle portion of the dielectric and dispense with the upper stop layer 98. In the case that the dielectric layers 96, 100 are silicon-based, such as oxidized organo-silane films, the stop layers 94, 98 are typically composed of silicon nitride (nominally $Si_3N_4$, but more generally $SiN_x$, where x may be between about 1.0 and 1.5). The cited patent applications to Yau et al. show a more complex structure for the layers 96, 100 of oxidized organo-silane films. The cap layer 102 is composed of silica, such as TEOS (tetraethylorthosilicate) oxide, and is used as a barrier to protect the underlying oxidized organo-silane layer 100, which is hygroscopic and whose dielectric constant is expected to vary if the oxidized organo-silane film absorbs any water vapor from the ambient.

Figure 2:
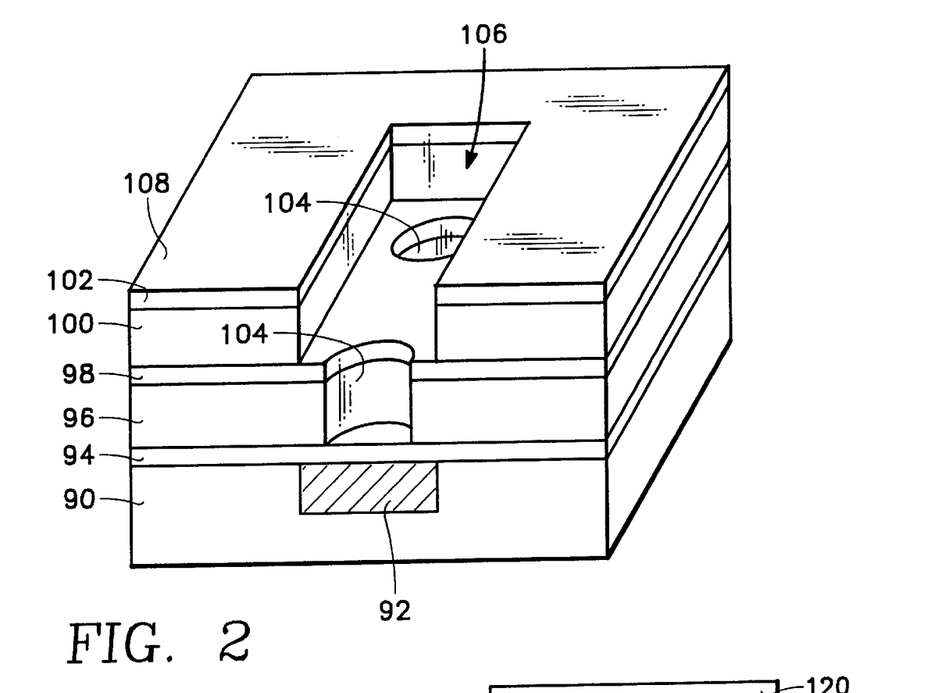
FIG. 2 is a cross-sectional view of a dual-damascene structure for forming interconnects in a multi-level integrated circuit.

One or more via holes 104 extend through the lower dielectric layer 96 and the two stop layers 94, 98 down to corresponding copper interconnects 92, only one being shown in FIG. 1. The portion of the lower nitride stop layer 94 at the bottom of the via hole 104 is removed in a post-etch soft plasma treatment following the main etching steps. A trench 106 extends through the cap layer 102 and the upper dielectric layer 100 and connects at its bottom with the via holes 104.

There are two principal techniques for forming the dual-damascene structure, the self-aligned and the counterbore dual-damascene processes. In the self-aligned dual-damascene process, explained in the context of using oxidized organo-silane films for the dielectric layers, the lower nitride stop layer 94, the lower dielectric layer 96, and the upper nitride stop layer 98 are first deposited. Then, a photolithographic step photographically defines a via pattern in a photoresist layer and etches through the patterned photoresist to form an incomplete via hole principally in the nitride upper stop layer 98. Thereafter, the upper dielectric layer 100 and the silica cap layer 102 are deposited, and a photomask having the trench pattern is formed over the cap layer 102. An etching step that selectively etches silica to nitride etches through the silica cap layer 102 and the silica-based upper dielectric layer 100 down to the nitride upper stop layer 98of both stop layers 98, 94. This etching step forms both the trench 106 in the upper dielectric layer 100 and the via 104 in the lower dielectric layer 96.

On the other hand, in the counterbore dual-damascene process, both stop layers 94, 98 and both dielectric layers 96, 100 are deposited before a first photolithographic step etches an extended via hole through the silica cap layer 102, the upper dielectric layer 100, the nitride upper stop layer 98, and the lower dielectric layer 96 but stops on the lower nitride stop layer 94. Because of the differing materials and the need for a final etch stop layer, a multi-step etch is anticipated. Then a second photolithographic step etches the silica cap layer 102 and the upper dielectric layer to form the trench 106 but stops on the upper nitride stop layer 98 and does not appreciably etch the lower nitride stop layer 94, which is exposed for the entire second etch.

The etching required for commercial implementation of either version of the dual-damascene process entails the etching of holes having high aspect ratios, that is holes having a high ratio of their depth to their minimum width. Aspect ratios of three are the minimum expected, and ratios of five or more may be required.

Once the structure of FIG. 2 has been formed, a metallization stack is deposited into the via holes 104 and the trench 106 in one deposition sequence, and it likely overflows over the top surface 108 of the cap layer 102. The deposition sequence may include a barrier layer and a seed layer in addition to the metal layer. The metal deposition may be performed by chemical vapor deposition (CVD), physical vapor deposition (PVD), a combination of CVD and PVD, electroplating, or electroless plating. Chemical mechanical polishing (CMP) is then performed to remove all of the metallization above the insulating surface 108. The metal filling the trench 106 produces an upper-level horizontal interconnect, and the metal filling the via holes 104 produces inter-level vertical interconnects. The chemical mechanical polishing of a dual-damascene structure is particularly useful with copper metallization since it allows definition of copper vias and interconnects without a copper etching step. Copper is difficult to etch in a dry plasma, and presently available copper plasma etches are more expensive than the dual-damascene process.

Recipes based on either trifluoromethane ($CHF_3$) or octafluorocyclobutane ($C_4F_8$) were further developed using the structure presented in TABLE 3 and in which the photoresist was patterned for trenches having a width of about 500 nm. This structure mimics the nitride stop layer used with silica-based dielectrics. These two types of recipes were pursued because of their close similarity to useful oxide etch recipes.

TABLE 3

| Composition | Thickness (nm) |
| --- | --- |
| Photoresist | 1050 |
| Oxidized organo-silane film | 550 |
| $SiN_x$ | 130 |
| Si | |

Using Recipe-1 of TABLE 2 with $C_4F_8$ on the patterned structure of TABLE 3 produces a oxidized organo-silane film etch rate of 900 nm/min, a photoresist selectivity of 11.7, and a vertical profile of 86°. The etch stops on the underlying nitride. The increase in etch rate in the narrow trench can be explained by the etch being reactant limited. Using Recipe-6 of TABLE 2 with $CHF_3$ produces similarly good results.

The $C_4F_8$ was also applied to a silica-capped layer of an oxidized organo-silane film with the structure summarized in TABLE 4 and with trenches patterned for widths of either 0.36 or 0.4 μm.

TABLE 4

| Composition | Thickness (nm) |
| --- | --- |
| Silica | 100 |
| Oxidized organo-silane film | 600 |
| $SiN_x$ | 100 |
| Si | |

The same etch removes the silica cap and the oxidized organo-silane film layer but stops on the nitride. The vertical profile is acceptable, but it could be improved by using a leaner (less polymerizing) chemistry. Whatever residues form on the sidewalls can be removed by an oxygen plasma.

However, several problems remain in applying the recipes to more difficult structures and as part of an integrated process. Etching through greater thicknesses of dielectric is required, for example, in the dual-damascene structure of FIG. 1. The removal of residue by oxygen plasma is effective for its task, but oxidized organo-silane films are expected to absorb oxygen, especially monoatomic oxygen radicals available in an oxygen plasma, with anticipated deleterious effects on the dielectric constant. The known integrated etch processes also use oxygen plasmas in their final steps. Finally, any dual-damascene process must include a nitride etching step.

Figure 3:
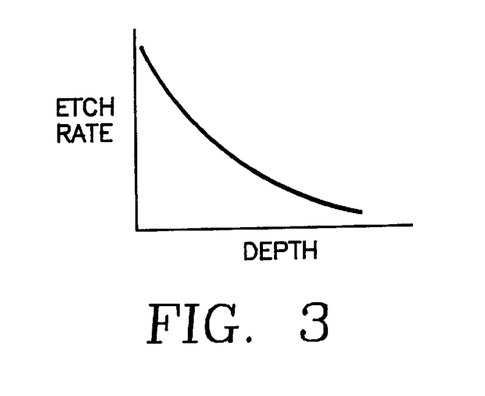
FIG. 3 is a schematical graph of the non-linear etching of oxidized organo-silane film in a narrow hole.

It is observed that, as schematically illustrated in the graph of FIG. 3, the oxidized organo-silane film etch rate significantly decreases with increasing hole depth. Indeed, for thicknesses of oxidized organo-silane films greater than about 600 nm, etch stop is often observed. More details on etch stop and methods of preventing it will be described later.

A further set of problems arise from the need to integrate the oxidized organo-silane film etch with a complete process for forming a dual-damascene structure. An integrated process for carbon-based BCB has been described by Hung et al. in U.S. patent application Ser. No. 09/112,094, filed Jul. 9, 1998, and Ser. No. 09/149,810, filed Sep. 8, 1998. After the completion of the etching of the dual-damascene structure shown in FIG. 2, whether by a self-aligned or a counterbore process, an ashing step, often called a post-etch treatment (PET), removes any remaining photoresist and at least some of the polymer that has formed in the via hole. Then, a final soft etch removes the thin nitride stop layer just above the metal to be contacted. An example of the corrected final steps of the process of Hung et al. is summarized in TABLE 5 including the trench etch of silica in the counterbore process.

TABLE 5

| | Trench Etch | PET | Nitride Etch |
| --- | --- | --- | --- |
| $C_4F_8$ Flow (sccm) | 14 | 0 | 0 |
| $CH_2F_2$ Flow (sccm) | 0 | 0 | 40 |
| $O_2$ Flow (sccm) | 0 | 400 | 60 |
| Ar Flow (sccm) | 100 | 0 | 100 |
| Source Power (W) | 1300 | 3200 | 1740 |
| Bias Power (W) | 1400 | 150 | 150 |
| Pressure (mT) | 7 | 60 | 9 |
| Roof Temp. (° C.) | 180 | 180 | 180 |
| Ring Temp. (° C.) | 270 | 270 | 270 |
| Cathode Temp. (° C.) | −10 | −10 | −10 |
| Backside He Pressure (T) | 15 | 15 | 15 |
| Time (s) | 100 | 60 | 100 |

Both of the last two plasma etch steps of TABLE 5 involve a considerable amount of oxygen. It is believed that oxidized organo-silane films have a somewhat porous structure, and the oxygen available in these steps of the integrated process diffuses into the dielectric.

It was attempted to substitute the oxygen-plasma PET with a wet clean using EKC-265 or EKC-830, standard cleaning agents commercially available from EKC Technology distributing from Hayward, California, or ACT-970, available from Ashland Chemical Co. of Pennsylvania. These liquid cleaning agents by themselves are unable to remove the residue observed after fluorocarbon etching of oxidized organo-silane films. A standard oxygen-plasma treatment for 45 minutes removes the residue, but a wet clean is still believed to be required after the oxygen-plasma treatment. Therefore, it appears that the problems arising from an oxygen plasma need to be dealt with and that methods that avoid oxygen in etching oxidized organo-silane films are unnecessarily restrictive.

One test structure used in developing a realistic etch process is summarized in TABLE 6.

TABLE 6

| Composition | Thickness (nm) |
|---|---|
| Photoresist | 1100 |
| Nitride | 100 |
| Oxidized organo-silane film | 1300 |
| $SiN_x$ | 100 |
| Si | |

The structure mimics the counterbore via etch which must extend through two layers of dielectric and an intervening nitride stop layer.

The etching tests were performed with constant temperature settings listed in TABLE 7.

TABLE 7

| Roof Temp. (° C.) | 180 |
|---|---|
| Ring Temp. (° C.) | 270 |
| Cathode Temp. (° C.) | −10 |
| Backside He Pressure (T) | 15 |

An initial recipe for a two-step etch and subsequent post-etch treatment (PET) is summarized in TABLE 8. Again the source power is distributed between the two coils in proportions to optimize uniformity.

TABLE 8

| | Etch-1 | Etch-2 | PET |
|---|---|---|---|
| $CHF_3$ Flow (sccm) | 83 | 83 | |
| $C_4F_8$ Flow (sccm) | | 5 | |
| CO Flow (sccm) | 15 | | |
| Ar Flow (sccm) | 425 | 425 | |
| $O_2$ Flow (sccm) | | | 500 |
| Source Power (W) | 3020 | 3020 | 2265 |
| Bias Power (W) | 1400 | 1400 | 0 |
| Pressure (mT) | 50 | 50 | 15 |
| Time (s) | 30 | 150 | 60 |

The first etch step is intended to etch through the upper nitride layer with the addition of CO to decrease selectivity to nitride. The second etch step is intended to complete the etch through the oxidized organo-silane film but to stop on the lower nitride layer due to the inclusion of the $C_4F_8$, which is more polymerizing than $CHF_3$ and is particularly effective in protecting non-oxide layers on hole bottoms.

The post-etch treatment removes photoresist and most residues. However, a subsequent wet cleaning in EKC solvent is still recommended.

With this recipe applied to a 0.5 μm-wide via etch, the sidewall profile is very good, but etch stop occurs after a total depth of about 1 μm.

The recipe was then modified as listed in TABLE 9 to eliminate the heavily polymerizing $CHF_3$ and to reduce the pressure and the plasma source power in the second step.

TABLE 9

| | Etch-1 | Etch-2 |
|---|---|---|
| $CHF_3$ Flow (sccm) | 83 | |
| $C_4F_8$ Flow (sccm) | | 14 |
| CO Flow (sccm) | 15 | |
| Ar Flow (sccm) | 425 | 100 |
| $O_2$ Flow (sccm) | | |
| Source Power (W) | 3020 | 1345 |
| Bias Power (W) | 1400 | 1500 |
| Pressure (mT) | 50 | 7 |
| Time (s) | 30 | 180 |

The results show that the first etch step removes not only the upper nitride layer but also 500 nm of the oxidized organo-silane film. Etch stop is still observed at a total depth of about 900 nm, that is, an oxidized organo-silane film depth of 750 nm. That is, polymer or other residue still builds up at the bottom.

The first etch step appears to be satisfactory although overly long. An 8 second etch almost eliminates the upper nitride layer so that a 15 second etch at these conditions should reliably punch through the upper nitride layer.

A further refinement somewhat increased the plasma source power in the second step, as shown by the recipe in TABLE 10.

TABLE 10

| | Etch-1 | Etch-2 |
|---|---|---|
| $CHF_3$ Flow (sccm) | 83 | |
| $C_4F_8$ Flow (sccm) | | 14 |
| CO Flow (sccm) | 15 | |
| Ar Flow (sccm) | 450 | 100 |
| $O_2$ Flow (sccm) | | |
| Source Power (W) | 3020 | 1460 |
| Bias Power (W) | 1400 | 1500 |
| Pressure (mT) | 50 | 7 |
| Time (s) | 15 | 180 |

Etch stop is observed at a depth of 750 nm in the oxidized organo-silane film for a 0.5 μm trench but at 1.1 μm for a 0.65 μm trench, almost down to the lower nitride layer. Extending the time for the second etch to 240 seconds does not cause holes in the center of the wafer to reach the lower nitride layer. Holes at the wafer edge do reach it, but they have significantly tapered profiles accompanied by a loss of critical dimension at the top of the hole.

We believe that the cause for etch stop in oxidized organo-silane films is due to the fluorine-based etching chemistry being effective at volatilizing the silicon and oxygen components but ineffective at removing the carbon. As a result, the carbon is left behind and forms a growing fraction of the material at the etch front until the material to be etched becomes predominately carbon-based. Eventually, the fluorocarbon becomes unable to react with the carbon-rich material, and etching stops.

We thus believe that it is necessary to add nitrogen or oxygen, especially in the forms of $N_2$ or $O_2$, to the etching gas of the second step of a deep etch to volatize the carbon component of the oxidized organo-silane film to gaseous CN or CO respectively, which is then immediately pumped out of the chamber. The nitrogen or oxygen can be added either during the entire etch or only in a second substep during which etch stop otherwise becomes a problem.

However, when the recipe for the second step of TABLE 10 is modified by adding 20 sccm of oxygen, the oxidized organo-silane film is barely etched, and the photoresist is eroded to a tapered shape.

We also believe that a more aggressive (leaner) fluorine-based etching gas, such as $CF_4$ would etch deeper into the oxidized organo-silane film before carbon enrichment becomes a problem.

A problem associated with etching oxidized organo-silane films is that an oxygen plasma is used either in the main etch or in the ashing or post-etch treatment required in an integrated process. Apparently the porous character of oxidized organo-silane films allows the stuffing of atomic oxygen into the glassy or polymeric matrix of the material. The incorporated oxygen is weakly bound, either incorporated interstially or having dangling bonds. It thus easily polarizable and causes an increase in the dielectric constant.

We have discovered that a thermal anneal will remove the oxygen from oxidized organo-silane films and recover the reduced dielectric constant. A typical recovery anneal to remove the oxygen is performed at 2000 to 450° C. for 2 to 30 minutes in an inert ambient at either atmospheric pressure or sub-atmospheric pressures between 5 and 760 Torr. Inert gases include nitrogen, argon, helium, neon, etc., or the anneal may be performed in a vacuum. However, the annealing gas should contain substantially no oxygen that would prevent the out diffusion of oxygen from the oxidized silane film. We have performed the anneals reported here at 400° C. for either 15 or 30 minutes. The effectiveness of the recovery anneal is in contrast to some other organic low-k dielectrics which suffer irrecoverable damage from an oxygen plasma. however, the recovery anneal works only after some types of oxygen plasmas.

To test the recovery anneal, sample capacitors were formed on a blanket wafer covered with an oxidized organo-silane film. The oxygen plasma treatment applied to these structure is similar to that for the post-etch treatment of TABLE 8 except that it extends for 75 s. The measured capacitance is linearly related to the dielectric constant of the underlying oxidized organo-silane film. The results are summarized in TABLE 11 for one sample etched without RF bias applied to the pedestal during the oxygen-plasma etch and for another sampled etch with RF bias of 300 W applied to the pedestal supporting a 200 mm-diameter wafer during the etch, that is, a RF bias power density of no more than 10 $W/cm^2$

TABLE 11

| | Capacitance (pF) | |
|---|---|---|
| | Unbiased Etch | Biased Etch |
| Pre-etch | 127 | 125 |
| Post-etch | 165 | 203 |
| Post-recovery | 119 | 164 |

For the sample on which no bias is applied during exposure to the oxygen plasma, the etching produces a significant increase in dielectric constant, but the recovery anneal reduces dielectric constant to the original value prior to etching within the experimental accuracy. However, for the sample on which bias is applied during the oxygen-plasma etch, the etching produces an even large increase in dielectric constant, and the recovery anneal recovered part of the damage but not all of it. The conclusion is that the post-etch treatment and the nitride etch of Hung et al., as summarized in TABLE 5, need to be modified to include no significant pedestal biasing, at least in the presence of oxygen. No significant pedestal biasing may be defined as RF bias power density of less than 0.5 $W/cm^2$, preferably less than 0.1 $W/cm^2$, and most preferably no RF bias power. Such a recipe for the post-etch treatment has been presented in TABLE 8. Alternatively, the oxygen-plasma may be generated by a remote plasma source (RPS).

Figure 4:
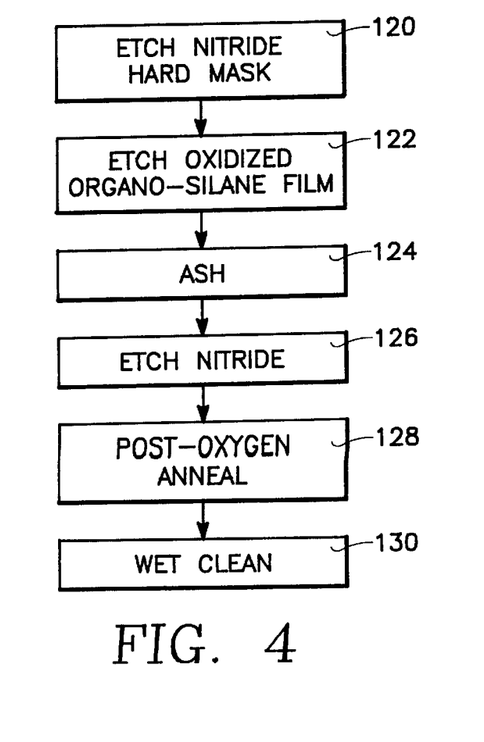
FIG. 4 is a flow diagram for an integrated etch process of the invention for etching oxidized organo-silane films.

The integrated process for etching oxidized organo-silane films is presented in the flow diagram of FIG. 4. In step 120, the silicon nitride hard mask is etched through a patterned photoresist layer using, for example, the recipe of the first column of TABLE 9. In step 122, the oxidized organo-silane film is etched through the patterned nitride hard mask using, for example, the recipe of the second column of TABLE 9. In an ashing step 124, an unbiased oxygen plasma removes any remaining photoresist and any polymer formed in the etched hole using, for example, the recipe of the third column of TABLE 8. In step 126, the thin nitride layer at the bottom of the hole is removed by a biased but soft (low power) plasma formed from a fluorocarbon, oxygen, and argon. A post-oxygen anneal 128 restores the dielectric constant to its low value by holding the substrate in an inert environment at 200 to 450° C. for 2 to 30 minutes. A final wet clean 130 removes any remaining residue using commonly available solvents such as those previously described. The post-oxygen anneal 128 should be delayed until after the wet clean 130.

Although the invention has been described in the context of a dual-damascene structure for etching a via it is not so limited, and it may be applied to other structures.

Although the examples presented above have concentrated on $C_4F_8$ as the primary fluorocarbon etching gas, other fluorocarbons (including hydrofluorocarbons) may be used singly or in combination to etch oxidized organo-silane films depending upon the required geometric structure and selectivity. Fluorocarbon gases include those that are liquid at operational temperatures and pressures but are be atomized in a carrier gas.

The invention is not limited to oxidized organo-silane films formed according the method of Yau et al., and it my be applied to materials of similar compositions and/or structures formed by other methods. The importance of the silicon content in the low-k dielectric film has not been clearly demonstrated.

Although the invention has been described as being practiced in the IPS etch reactor, it may be practiced in other etch reactors. Other inductively coupled plasma reactors are known including those with planar coils. It is known that other types of reactors can provide a source plasma, particularly a high-density plasma, apart from the capacitively coupled pedestal electrode. Examples of other remote plasma sources are a remote plasma source (RPS) or an electron-cyclotron resonance (ECR) reactor. Although a separated excited source plasma is particularly advantageous, many advantages of the invention may be exploited using a capacitively coupled plasma reactor, with or without magnetic enhancement.

The invention thus provides an effective method of etching a new and beneficial material using apparatus and processing chemicals well known in the field. The invention also provides an integrated process for all the etching steps including cleaning for one level of dielectric.

What is claimed is:

1. A method of etching a carbon-doped dielectric comprising hydrogen, carbon, silicon, and oxygen, an atomic percentage of said carbon being between 5 and 25% and an atomic percentage of said silicon being between 15 and 25%, and an atomic percentage of said hydrogen being between 35 and 60%, said method comprising the steps of:
   a first step of flowing a first etching gas mixture into a reaction chamber containing a pedestal electrode supporting a substrate having a patterned mask formed over said carbon-doped dielectric, said first etching gas mixture comprising a fluorocarbon and a chemically inactive gas;
   RF biasing said pedestal electrode; and
   a first step of exciting said first etching gas into a first plasma to thereby etch said carbon-doped dielectric while said pedestal electrode is RF biased.

2. The method of claim 1, wherein said first exciting step includes inductively coupling RF power into said chamber.

3. The method of claim 1, further comprising:
   a subsequent, second step of flowing a second etching gas into said reaction chamber comprising a carbon-volatizing gas; and
   a second step of exciting said second etching gas into a second plasma.

4. The method of claim 1, wherein said first exciting step excites said first plasma into a high-density plasma in a source region apart from said pedestal electrode.

5. The method of claim 1, wherein said first etching gas mixture additionally comprises a carbon-volatizing gas.

6. The method of claim 5, wherein said carbon-volatizing gas comprises nitrogen.

7. The method of claim 5, wherein said carbon-volatizing gas comprises oxygen.

8. The method of claim 1, wherein said first etching mixture contains no carbon-volatizing gas.

9. The method of claim 1, further comprising:
   a second step of flowing a second etching gas mixture into said reaction chamber, said second etching mixture comprising a fluorocarbon, a chemically inactive gas, and a carbon-volatizing gas; and
   a second step of exciting said second etching gas into a second plasma while said pedestal electrode is RF biased to thereby etch said carbon-doped dielectric.

10. The method of claim 9, wherein said carbon-volatizing gas comprises nitrogen.

11. The method of claim 9, wherein said carbon-volatizing gas comprises oxygen.

12. The method of claim 1, further comprising:
   a second step of flowing a second etching gas mixture into said reaction chamber, said second etching mixture comprising oxygen; and
   a second step of exciting said second etching gas into a plasma.

13. The method of claim 12, wherein said second exciting step is performed while said pedestal electrode is not substantially RF biased.

14. The method of claim 13, wherein said second steps of flowing and exciting are performed after said oxidized organo-silane film has been etched through to thereby remove residues.

15. The method of claim 12, wherein said second gas mixture consists essentially of oxygen.

16. The method of claim 12, further comprising, after said second exciting step, a step of annealing said substrate in a substantially oxygen-free environment.

17. The method of claim 16, wherein said annealing is performed in an inert atmosphere at between 200 and 450° C.

18. The method of claim 1, wherein said fluorocarbon comprises octafluorocyclobutane.

19. The method of claim 1, wherein said fluorocarbon comprises trifluoromethane.

20. The method of claim 1, wherein a silica layer overlies said carbon-doped dielectric and is overlaid by said patterned mask and wherein said first exciting step etches through said silica layer.

21. The method of claim 1, wherein a nitride layer overlies said carbon-doped dielectric and further comprising the steps performed before said first flowing step of:
   a second step of flowing a second gas mixture into said reaction chamber, said second gas mixture comprising said fluorocarbon, said chemically inactive gas, and another gas reducing selectivity to said nitride layer.

22. The method of claim 21, wherein said another gas comprises carbon monoxide.

23. A method of etching a film formed by oxidizing an organo-silane gas in a plasma excited with a surface power density of less than 1 $W/cm^2$ at a temperature of less than 100° C., said etching method comprising the steps of:
   a first step of flowing a first etching gas into a reaction chamber containing a pedestal electrode supporting a substrate having a patterned mask formed over said film, said first etching gas comprising a fluorocarbon and a chemically inactive gas;
   RF biasing said pedestal electrode; and
   a first step of exciting said first etching gas into a plasma to thereby etch said film while said pedestal electrode is RF biased.

24. The method of claim 23, wherein said first exciting step includes inductively coupling power into said chamber.

25. The method of claim 23, wherein said first etching gas additionally comprises a carbon-volatizing gas.

26. The method of claim 23, further comprising:
   a second step of flowing into said chamber a second etching gas comprising oxygen; and
   a second step of exciting said second gas mixture into a plasma while said pedestal electrode is not substantially RF biased.

27. The method of claim 26, further comprising the subsequent step of annealing said film in an inert environment at a temperature of between 200 and 450° C.

28. A method of etching a hole having a high aspect ratio in a film of a low-k dielectric material comprising carbon, oxygen, and hydrogen overlying a non-oxide layer formed in a substrate, comprising the steps of:
   flowing a first etching gas into a reaction chamber containing a pedestal electrode supporting said substrate having a patterned mask for said hole formed over said film, said first etching gas comprising a fluorocarbon gas, a carbon-volatizing gas, and a chemically inactive gas;
   RF biasing said pedestal electrode; and
   inductively coupling RF power into said reaction chamber to excite said first etching gas mixture into a plasma to thereby etch said film while said pedestal electrode is RF biased.

29. The method of claim 28, wherein said low-k dielectric material additionally comprises silicon.

30. The method of claim 28, wherein a flow of said chemically inactive gas is at east three times as large as a flow of said fluorocarbon gas.

31. The method of claim 28, further comprising:
a second step of flowing into said chamber a second etching gas comprising oxygen; and
exciting said second etching gas into a plasma while said pedestal electrode is not substantially RF biased.

32. The method of claim 31, wherein said low-k material additionally comprises silicon.

33. The method of claim 31, further comprising the subsequent step of annealing said film in an inert environment at a temperature of between 200 and 450° C. to reduce an effect of said second exciting step increasing a dielectric constant of said film.

34. The method of claim 28, wherein said carbon-volatizing gas comprises either gaseous nitrogen or oxygen.

35. A method of etching a low-k dielectric film comprising carbon, hydrogen, and oxygen formed over a non-oxide film, comprising the steps of:
flowing a first etching gas into a reaction chamber containing a pedestal electrode supporting said substrate having a patterned mask for said hole formed over said low-k dielectric film, said first etching gas comprising a fluorocarbon and a chemically inactive gas;
RF biasing said pedestal electrode;
exciting said first etching gas into a plasma to thereby etch said low-k dielectric film while said pedestal electrode is RF biased;
a subsequent, second step of flowing into said chamber a second etching gas comprising oxygen; and
a second step of exciting said second etching gas into a plasma while said pedestal electrode is not substantially RF biased.

36. The method of claim 35, further comprising the subsequent step of annealing said low-k dielectric film in an inert environment at a temperature of between 200 and 450° C. to decrease an effect of said second exciting step increasing a dielectric constant of said low-k dielectric film.

37. The method of claim 36, wherein said low-k dielectric film additionally comprises silicon.

38. The method of claim 35, wherein said low-k dielectric film additionally comprises silicon.

39. The method of claim 35, wherein said first etching gas additionally comprises a carbon-volatizing gas selected from the group consisting of gaseous oxygen and gaseous nitrogen.

40. The method of claim 35, wherein during said first flowing step a flow of said chemically inactive gas is at least three times as great as a flow of said fluorocarbon.

* * * * *